(12) United States Patent
Sharma et al.

(10) Patent No.: US 11,699,681 B2
(45) Date of Patent: Jul. 11, 2023

(54) MULTI-CHIP MODULE HAVING A STACKED LOGIC CHIP AND MEMORY STACK

(71) Applicant: Intel Corporation, Santa Clara, CA (US)

(72) Inventors: Abhishek Sharma, Hillsboro, OR (US); Hui Jae Yoo, Hillsboro, OR (US); Van H. Le, Beaverton, OR (US); Huseyin Ekin Sumbul, Portland, OR (US); Phil Knag, Hillsboro, OR (US); Gregory K. Chen, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/727,779

(22) Filed: Dec. 26, 2019

(65) Prior Publication Data

US 2020/0135700 A1    Apr. 30, 2020

(51) Int. Cl.
*H01L 25/065* (2023.01)
*G11C 11/407* (2006.01)

(52) U.S. Cl.
CPC ........ *H01L 25/0657* (2013.01); *G11C 11/407* (2013.01); *H01L 2224/32145* (2013.01); *H01L 2224/32225* (2013.01)

(58) Field of Classification Search
CPC ....... H01L 25/0657; H01L 2224/05548; H01L 2224/094; H01L 25/18
See application file for complete search history.

(56) References Cited

U.S. PATENT DOCUMENTS

| | | | | |
|---|---|---|---|---|
| 7,186,590 B2* | 3/2007 | Alcoe | ................... | H01L 23/427 257/E23.101 |
| 11,157,421 B2* | 10/2021 | Zhu | ....................... | H03K 19/177 |
| 2005/0224946 A1* | 10/2005 | Dutta | .................... | G02B 6/4257 257/686 |
| 2010/0283505 A1* | 11/2010 | Koch | ................ | H03K 19/17748 716/103 |
| 2012/0146207 A1* | 6/2012 | Chou | ....................... | H01L 25/18 438/107 |
| 2019/0198489 A1* | 6/2019 | Kim | ........................ | H01L 25/18 |

\* cited by examiner

*Primary Examiner* — Dale E Page
*Assistant Examiner* — Wilner Jean Baptiste
(74) *Attorney, Agent, or Firm* — Compass IP Law PC

(57) ABSTRACT

An apparatus is formed. The apparatus includes a stack of semiconductor chips. The stack of semiconductor chips includes a logic chip and a memory stack, wherein, the logic chip includes at least one of a GPU and CPU. The apparatus also includes a semiconductor chip substrate. The stack of semiconductor chips are mounted on the semiconductor chip substrate. At least one other logic chip is mounted on the semiconductor chip substrate. The semiconductor chip substrate includes wiring to interconnect the stack of semiconductor chips to the at least one other logic chip.

20 Claims, 15 Drawing Sheets

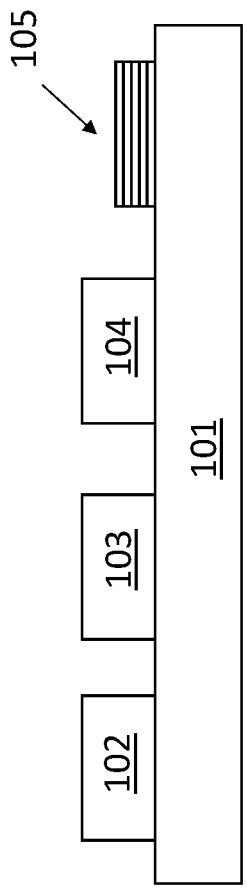

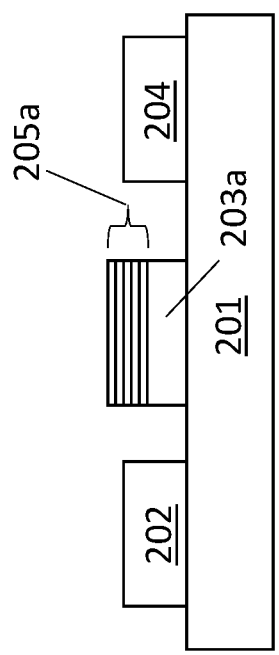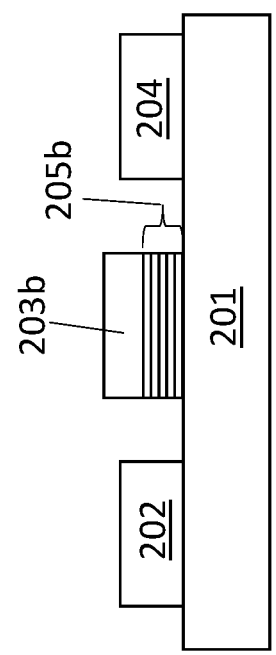

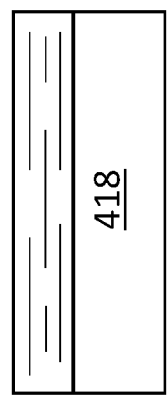
Fig. 4a
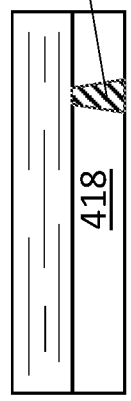
Fig. 4b
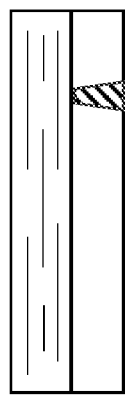
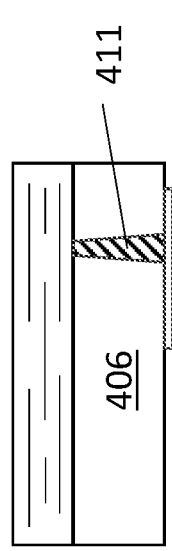
Fig. 4c

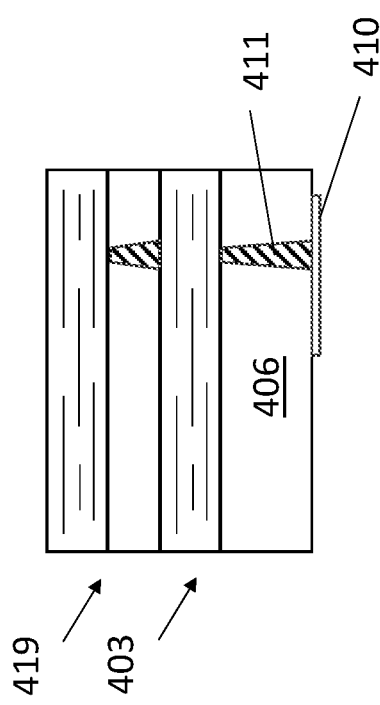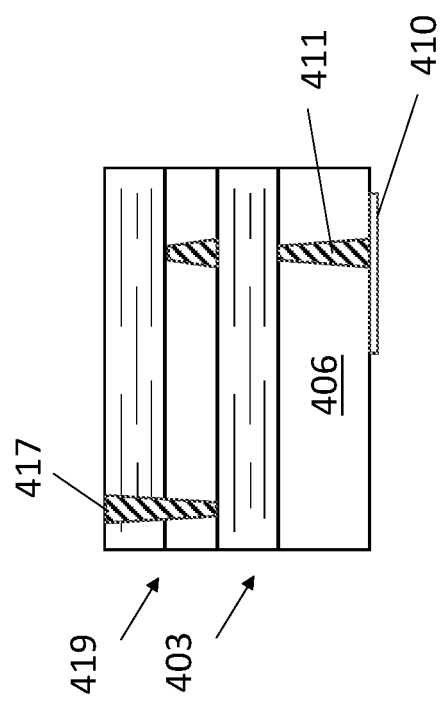

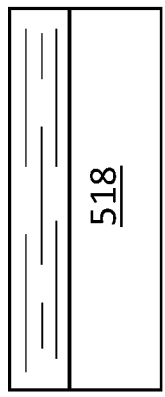
Fig. 5a
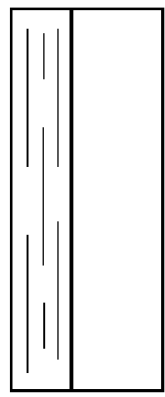
Fig. 5b
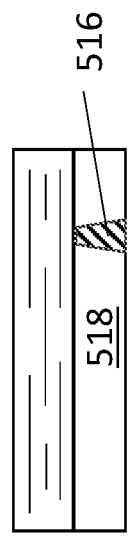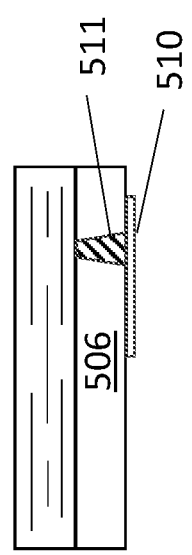
Fig. 5c

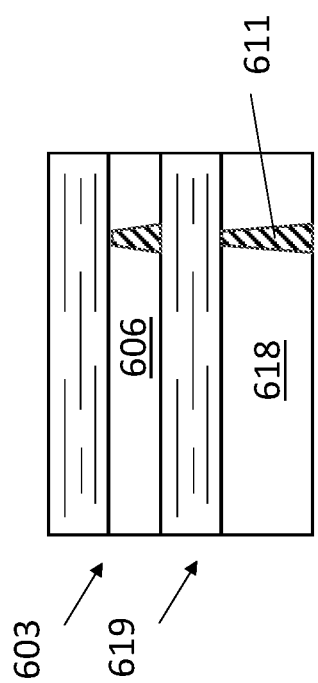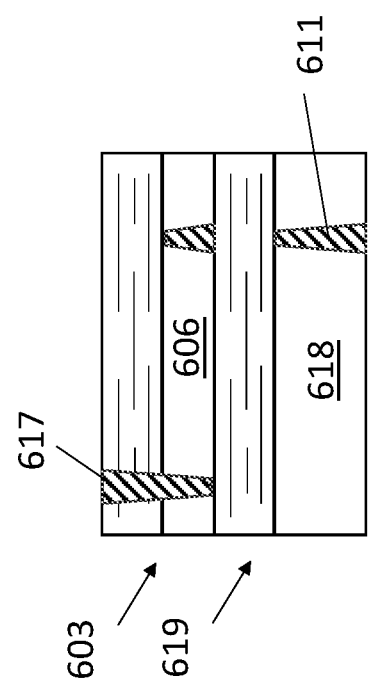

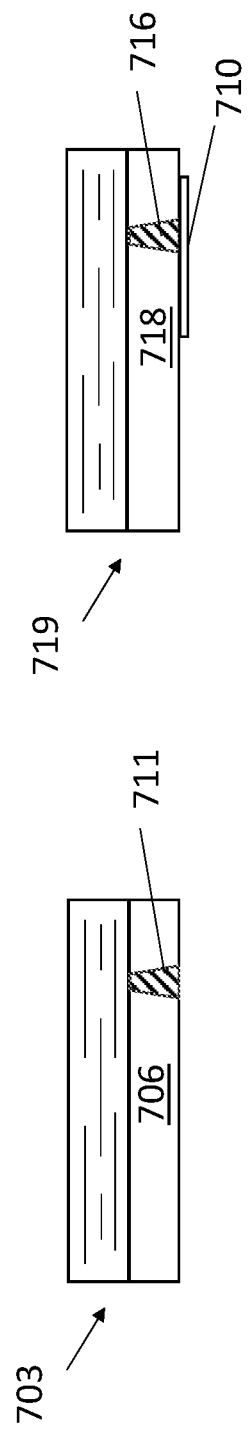

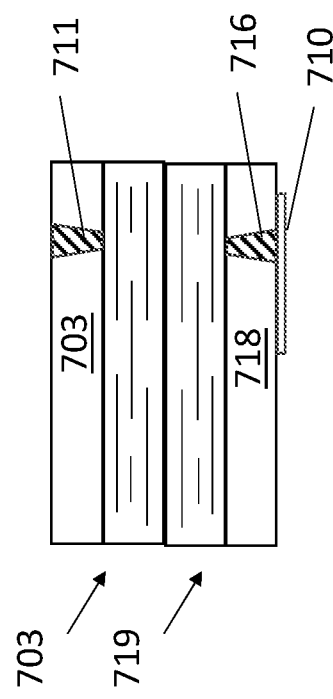
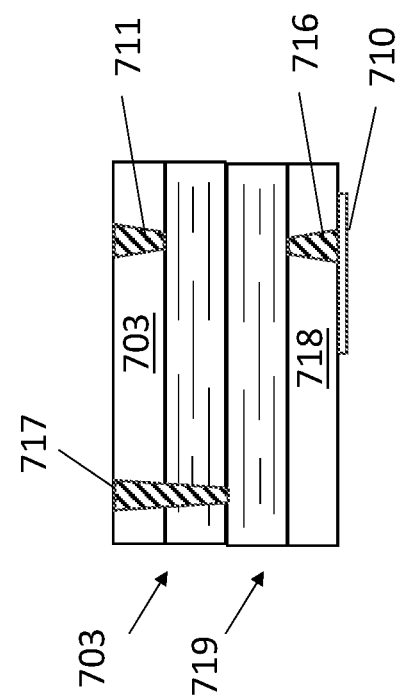

MULTI-CHIP MODULE HAVING A STACKED LOGIC CHIP AND MEMORY STACK

FIELD OF INVENTION

The field of invention pertains generally to electrical arts, and, more specifically, to a multi-chip module having a stacked logic chip and memory stack.

BACKGROUND

With the advent of cloud computing, machine learning, artificial intelligence and other "big-data" applications, a premium is placed on accessing memory in as short an amount of time as possible, and/or, lowering the cost of implementing high speed memory.

FIGURES

A better understanding of the present invention can be obtained from the following detailed description in conjunction with the following drawings, in which:

FIG. 1 shows a standard multi-chip module (prior art);

FIGS. 2a and 2b show an improved multi-chip module;

FIGS. 4a, 4b, 4c, 4d and 4e show a first method of manufacturing a stacked logic chip and memory stack;

FIGS. 5a, 5b, 5c, 5d and 5e show a second method of manufacturing a stacked logic chip and memory stack;

FIGS. 6a, 6b, 6c, 6d and 6e show a third method of manufacturing a stacked logic chip and memory stack;

FIGS. 7a, 7b, 7c, 7d and 7e show a fourth method of manufacturing a stacked logic chip and memory stack;

DETAILED DESCRIPTION

Figure 3A:
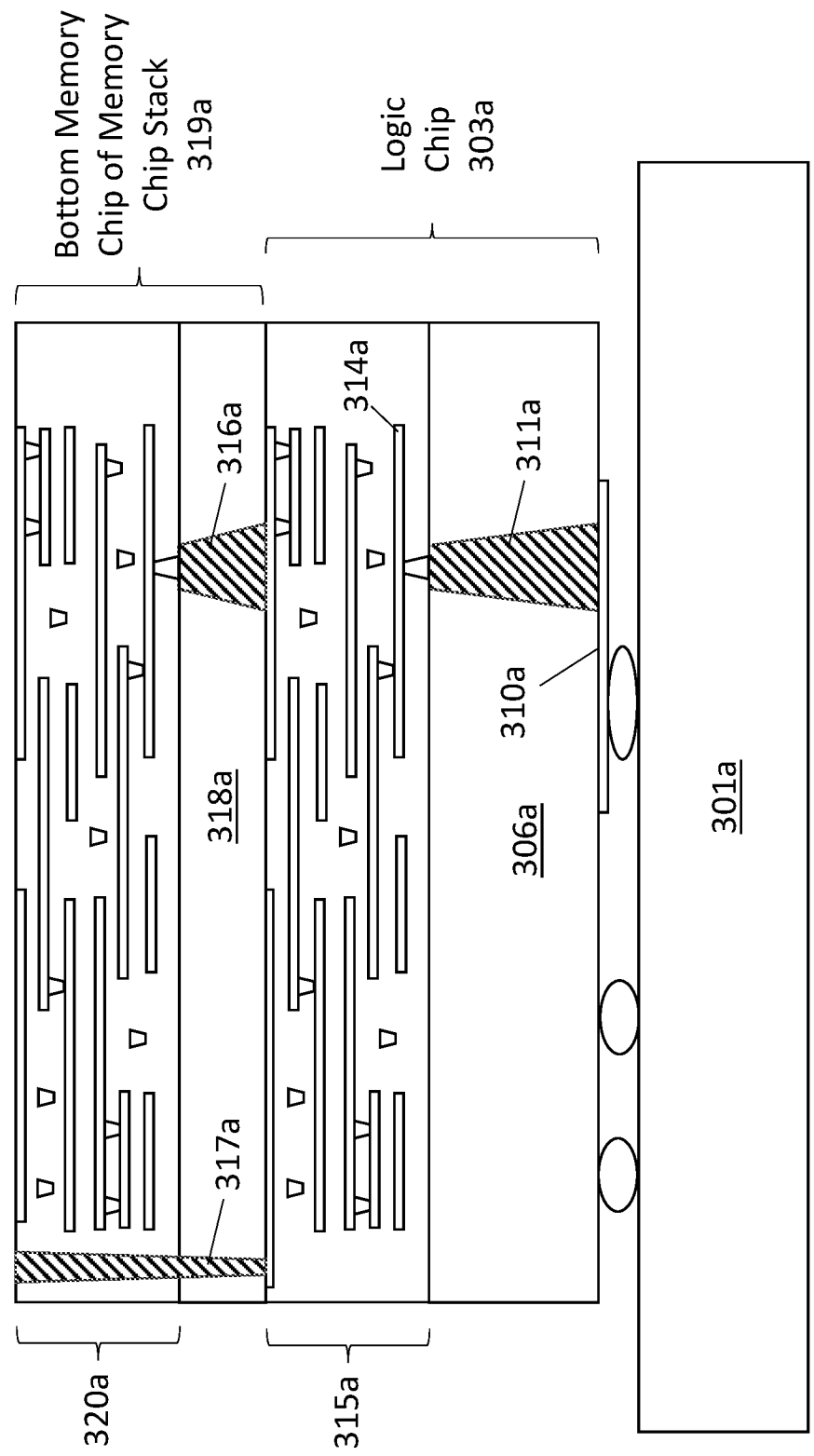
FIGS. 3a, 3b, 3c and 3d show different memory chip and logic chip interfaces.

FIG. 1 shows number of different functional semiconductor chips 102-105 mounted on a semiconductor chip substrate 101 that can be used, e.g., for a multi-chip module implementation. The functional semiconductor chips 102-105 can include, for example, any of: 1) a general purpose processor semiconductor chip 102 (e.g., a multi-CPU core system-on-chip); 2) a graphics processing unit (GPU) semiconductor chip 103; 3) a peripheral control hub semiconductor chip 104; and, 4) a stack of memory chips 105 ("memory stack") such as a stack of dynamic random access memory (DRAM) or static random access memory (SRAM) chips. Functional semiconductor chips 102, 103, 104 can be referred to as logic chips (because they generally contain dense logic circuits) as compared to the chips in the memory stack 105 which are referred to as memory chips.

The semiconductor chip substrate 101 acts as an interposer for the logic chips 102-104 and the memory stack 105 and includes top-side I/Os (e.g., pads, solder bumps, solder balls, etc.) that make electrical contact with corresponding I/Os formed on the respective undersides of the logic chips 102-104 and the bottom memory chip of the memory stack 105. The semiconductor chip substrate 101 also includes wiring to interconnect different ones of the functional chips to one another. In various implementations the semiconductor chip substrate can also include various active devices to form drivers, receivers, etc. to effect high speed communication between the functional chips through the semiconductor chip substrate 101.

The memory stack 105 is commonly used to keep data for a high performance logic chip such as multi-core CPU chip and/or GPU chip. Here, the semiconductor chip substrate 101 acts as a local interconnect between the memory stack 105 and a high performance logic chip having less parasitic capacitance than, e.g., larger I/Os on the package exterior and electronic traces that would otherwise couple to external memory. With less parasitic capacitance, the interconnect between any of the logic chips 102-104 that use the memory stack 105 and the memory stack 105 can support higher fundamental frequencies, which, in turn, corresponds to reduced memory access times.

With the advent of cloud computing, machine learning, artificial intelligence and other "big-data" applications, a general objective is to access memory quickly. Here, as big-data applications include the processing of large amounts of information, the logic chips 102-104 can better implement such applications the quicker they can read from and/or write to the memory chips in the memory stack 105.

As a consequence, the memory stack's memory chips are commonly "leading edge" memory chips that were fabricated with the most advanced available memory chip manufacturing technology. The use of leading edge memory chips maximizes the cost of the overall multi-chip implementation, at least from the perspective of the cost of the memory chips used in the memory stack 105.

FIGS. 2a and 2b depict two improved multi-chip implementations which both include a stacked memory stack 205 and logic chip 203. In FIG. 2a a memory stack 205a is placed upon a logic chip 203a (e.g., CPU SOC, GPU, etc.), whereas, in FIG. 2b the logic chip 203b is placed upon the memory stack 205b.

By stacking a memory stack 205 and logic chip 203, the capacitive parasitics between the logic chip 203 and the memory stack 205 are even further reduced as compared to the approach of FIG. 1 where the memory stack 105 is mounted directly on the semiconductor chip substrate 101. The reduced parasitics opens up two options for the multi-chip assembly manufacturer, either of which realizes an improvement over the standard multi-chip assembly of FIG. 1.

According to a first option, because the memory stack 205 should have reduced access times as compared to the approach of FIG. 1, if leading edge memory chips are used in the memory stack 205, the multi-chip module should exhibit reduced memory access times as compared to a solution that adopts the approach of FIG. 1 and also includes leading edge memory chips. Said another, if same memory chips are used across the approaches of FIG. 1 and FIGS. 2a/2b, the multi-chip module of FIGS. 2a/2b will result in a higher performing module than the multi-chip module of FIG. 1 (because the logic chips in the approach of FIGS. 2a/2b will enjoy smaller memory access times). Thus, for the same memory chip cost, the approach of FIGS. 2a and 2b yield a higher performance product.

According to a second option, cheaper memory chips that were not manufactured with a leading edge manufacturing process, and therefore have longer access times than other more expensive memory chips, can be used in the approaches of FIGS. 2a/2b and yet the performance of the resulting multi-chip module will be comparable to a multi-chip module of FIG. 1 that utilizes the most expensive, leading edge memory chips. Said another way, adopting the approach of FIGS. 2a/2b allows the manufacturer to use slower, less expensive memory chips yet still create a product that has comparable performance to a multi-chip module that adopts the approach of FIG. 1 and uses the most expensive, leading edge memory chips.

Thus, according to either option, the approach of FIGS. 2a/2b have reduced cost per memory access time.

Another improvement that can be realized with the approaches of FIGS. 2a/2b is smaller multi-chip module footprint size. That is, with the approach of FIGS. 2a/2b, the footprint of the semiconductor substrate 201 is reduced because no room needs to be separately made for the memory stack 205 unlike the approach of FIG. 1. Thus, the approach of FIGS. 2a/2b improves upon the approach of FIG. 1 not only with reduced cost per memory access time but also reduced motherboard surface area consumption. All of these improvements can yield higher performing big-data systems or reduced cost yet high performance big-data systems.

Other feature(s) of the approach of FIGS. 2a/2b is the manner in which power is delivered to the upper chip(s) in the overall stack.

For example, with respect to the approach of FIG. 2a (memory stack 205a on top of logic chip 203a), power can be delivered to the memory stack 205 by any/all of three different mechanisms: 1) power nodes are routed through the semiconductor chip substrate 201, through the lower logic chip 203a and into the memory stack 205a; 2) the multi-chip module package solution sandwiches/encapsulates the several chip layers and supplies "top-side power" to the upmost chip of the memory stack 205a (which includes pads and/or bumps on its exposed face to receive the power); and, 3) the multi-chip module package solution includes a "top-side interposer" that connects to the upmost chip of the memory stack 205a (which again includes pads and/or bumps on its exposed face to receive the power) and possibly laterally to other chips 202, 204 that are around the stacked memory stack 205a and logic chip 203a.

Likewise, with respect to the approach of FIG. 2b (logic chip 203b on top of memory stack 205b), power can be delivered to the logic chip 203b by any/all of three different mechanisms: 1) power nodes are routed through the semiconductor chip substrate 201, through the memory stack 205b and into the logic chip 203b; 2) the multi-chip module package solution sandwiches/encapsulates the several chip layers and supplies top-side power to the exposed face of the logic chip 203b (which includes pads and/or bumps on its exposed face to receive the power); and, 3) the multi-chip module package solution includes a top-side interposer that connects to the logic chip 203b (which includes pads and/or bumps on its exposed face to receive the power) and possibly laterally to other chips 202, 204 that are around the stacked logic chip 203b and memory stack 205b.

Figure 3B:
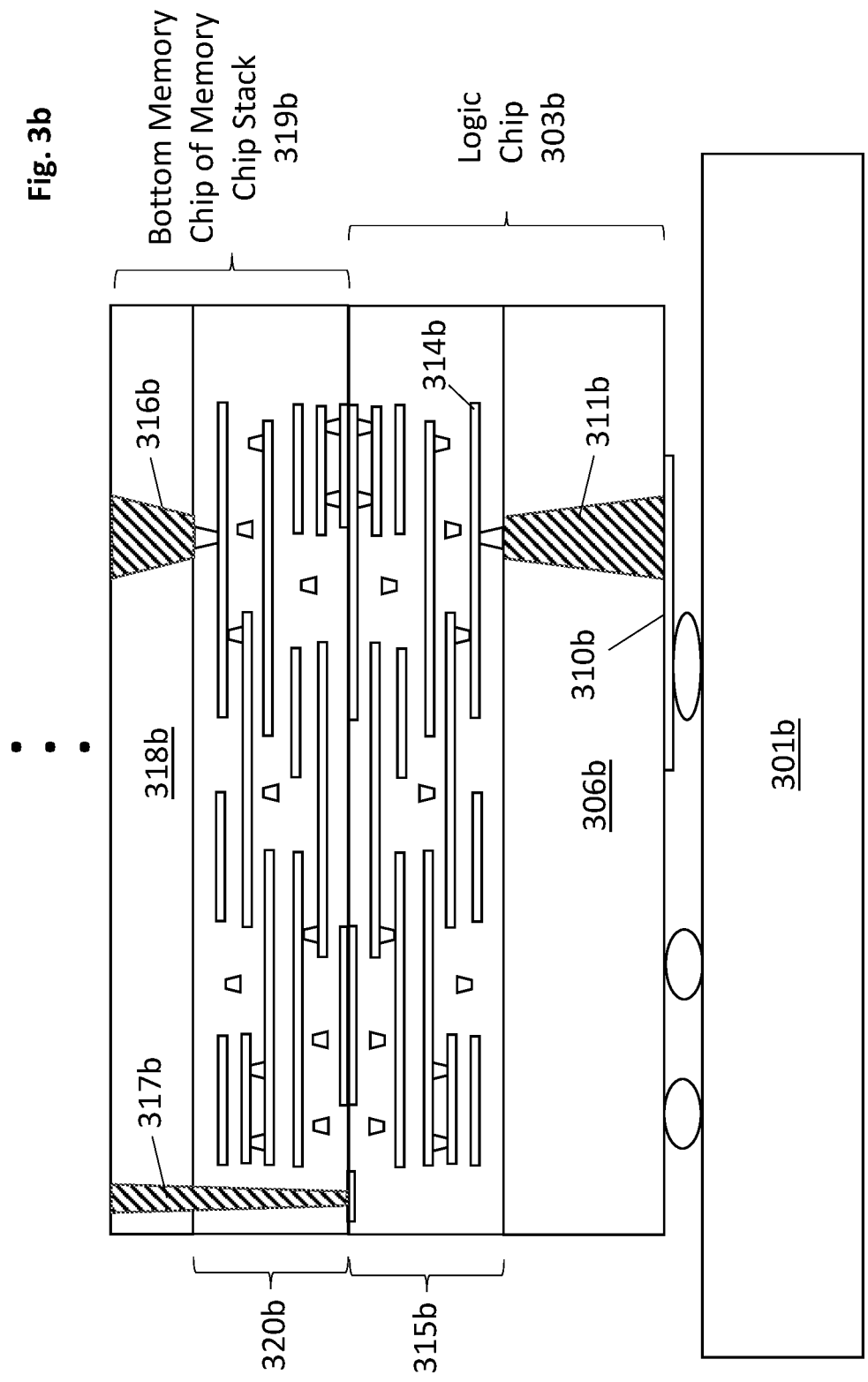
Figure 3C:
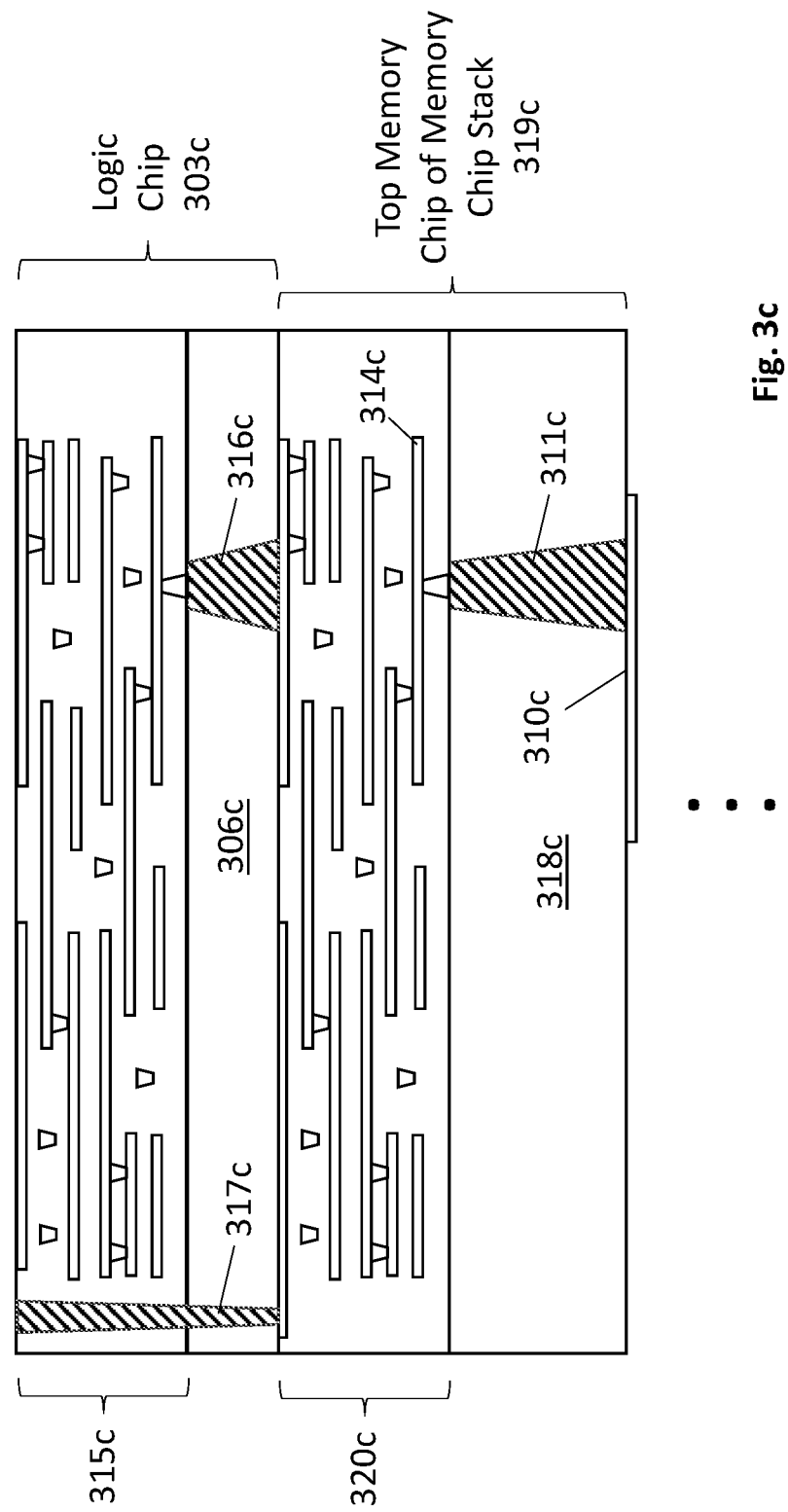
Figure 3D:
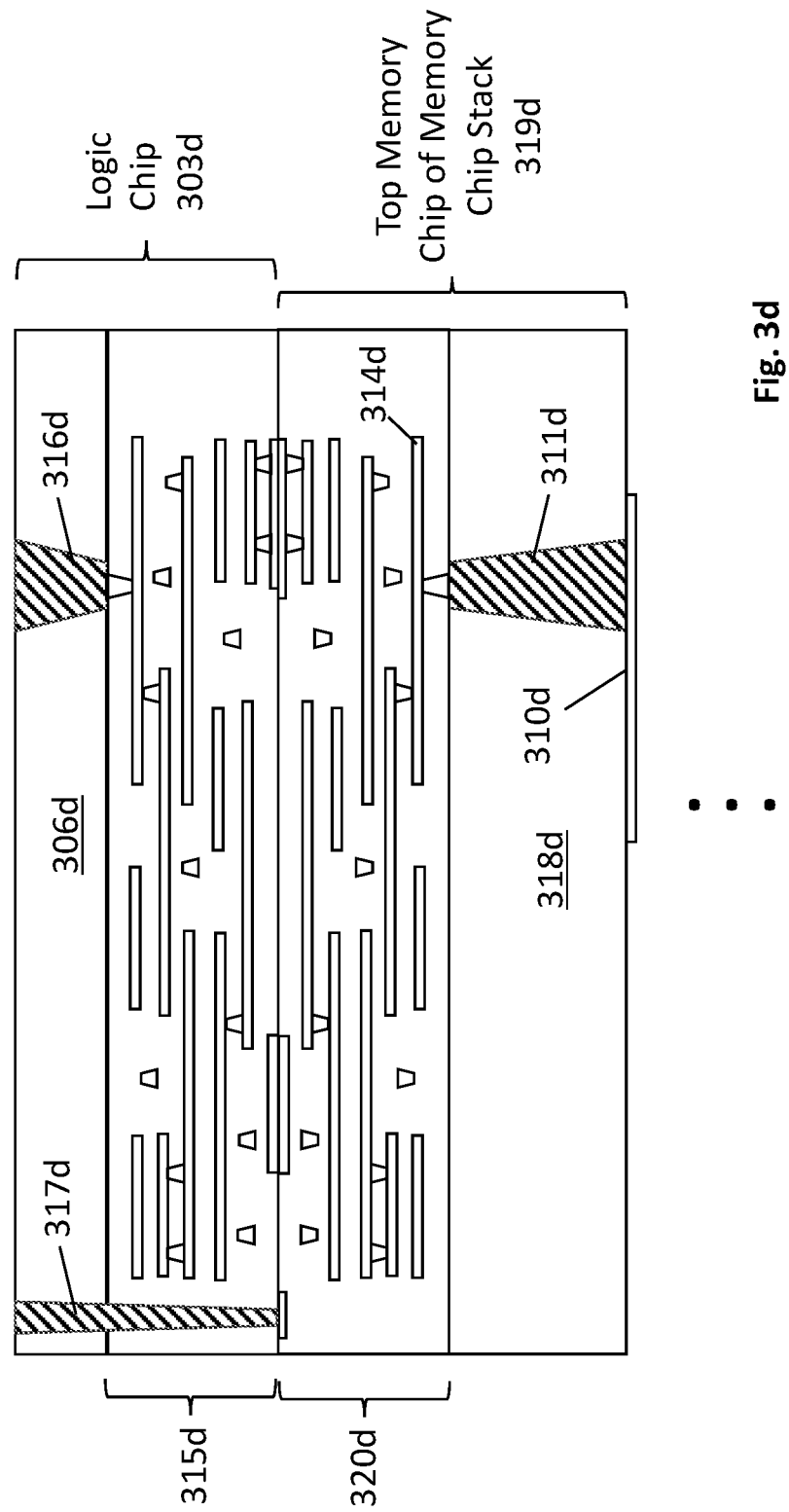
Figure 5D:
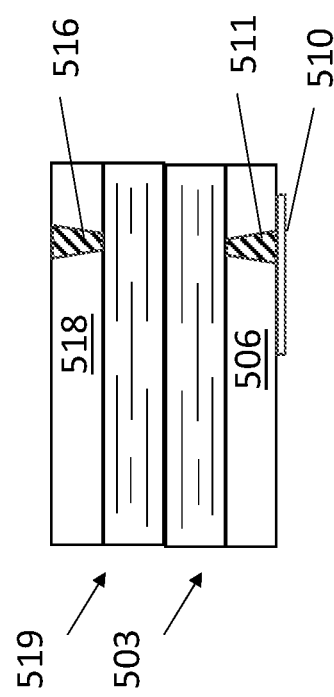
Figure 5E:
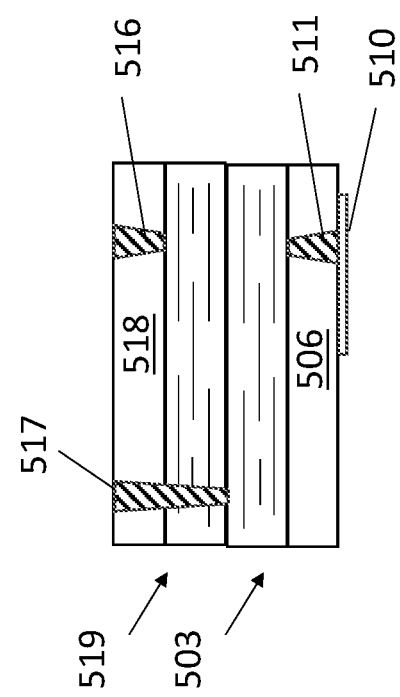
Figure 6A:
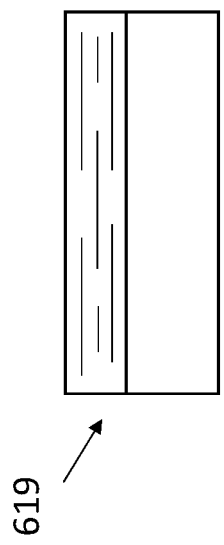
Figure 6B:
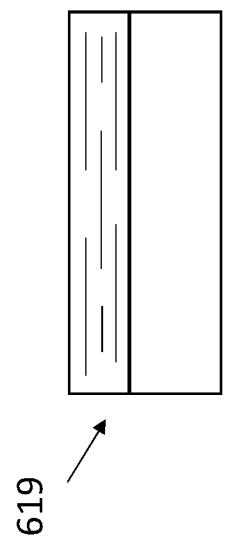
Figure 6C:
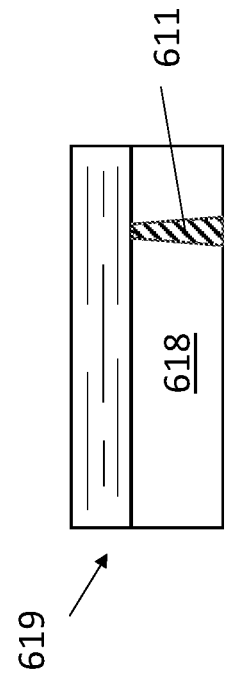

Irrespective of how power is delivered to the chips in the stack, engineering attention should be focused on the interface between the memory stack 205 and the logic chip 203. FIGS. 3a through 3d show cross sections of four different interface approaches. FIGS. 3a and 3b show first and second embodiments in which the memory chip stack sits on the logic chip as per FIG. 2a. FIGS. 3c and 3d show third and fourth embodiments in which the logic chip sits on the memory chip stack as per FIG. 2b.

The approaches of FIGS. 3a and 3c can be referred to as "face-to-back" approaches because the face of the lower chip interfaces with the back of the upper chip. Here, the "face" of a chip corresponds to the surface of the chip where the wiring layers are located and the "back" of a chip corresponds to the surface of the chip where the chip substrate is located. The approaches of FIGS. 3b and 3d can be referred to as "face-to-face" approaches because the face of the upper chip interfaces with the face of the lower chip.

Referring to the embodiment of FIG. 3a, the substrate 306a of the lower logic chip 303a has backside metallization 310a and one or more through silicon vias (TSVs) 311a through which the functional chip's power and/or signaling is routed through the semiconductor substrate 201. Here, inputs and/or I/Os on the underside of the logic chip's substrate 306a make electrical contact, e.g., by way of solder bumps or balls, to corresponding outputs and/or I/Os on the upper surface of the semiconductor chip substrate 301a. The semiconductor chip substrate 301a also includes inputs and/or I/Os (not shown) on its bottom surface that are electrically connected (e.g., by way of a package substrate) to the package's I/Os on the underside of the package (not shown).

The TSVs 311a within the logic chip substrate 306a make contact to, e.g., lower level metal 314a of the functional chip's interconnect wiring 315a. With power being received through the TSVs 311a and reaching the logic chip's interconnect wiring 315a, power can be readily distributed throughout the logic chip 303a by, e.g., forming power wires with the logic chip's interconnect wiring 315a.

Electrical connections between the lower logic chip 303a and the upper memory stack are effected with TSVs 316a, 317a that are formed in the substrate 318a of the bottom memory chip 319a of the memory stack. Notably, memory banks or other memory system architectures tend to have a same electrical node connected to multiple memory chips and a logic chip. For example, data bus structures, address bus structures, and/or control channels (for sending commands to the memory chips) each include a same wire or node that makes electrical contact to multiple memory chips and a logic chip (that, e.g., includes a memory controller).

As such, as observed in FIG. 3a, the TSV connections 316a, 317b that pass through the substrate 318a of the bottom memory chip 319a are connected to metallization/wiring structures in the memory chip's interconnect wiring 320a. At least one of the TSVs and/or electrical nodes connected to a TSV reach the top of the bottom memory chip 319a. Similar TSV and metallization wiring structures are formed in the next (higher) memory chip (not shown) that sits atop the bottom memory chip 319b. The memory chip to memory chip interface is then repeated for each next memory chip in the memory stack.

With respect to the approach of FIG. 3b, the interconnect wiring 320b of the bottom memory chip 319b in the memory stack faces the wiring face of the lower logic chip 303. As such, common node structures across chips are effected by running a same electrical node from the memory chips' interconnect wiring 320b through TSVs 316b, 317b within the bottom memory chip's substrate 318b. The face of the next memory chip in the stack connects to I/Os (e.g., lands) formed on the back end of the lower memory chip's substrate 318b and the pattern repeats for the subsequent memory chips in the stack.

Referring to the embodiment of FIG. 3c, the substrate 318c of the top memory chip 319c in the memory stack has backside metallization 310c and one or more TSVs 311c through which the bottom memory chip's power and/or signaling is routed. Power and/or signaling is similarly routed down through the memory stack to the bottom memory chip of the stack (note shown). The bottom memory chip of the memory stack has I/Os on the underside of its substrate which make electrical contact to the package's external I/Os on the package underside. Such electrical connection can be made through a package substrate (not shown).

As alluded to above, electrical nodes and/or connections from the bottom memory chip through the rest of the memory stack are effected by standard memory chip stacking. Here, with TSVs, bus structures and power can be routed up through the memory chips in the memory stack. The face of the top memory chip 319*c* in the memory chip stack interfaces with the backside of the logic chip 303*c*. Here, the substrate 306*c* of the logic chip 303*c* includes TSVs 316*c*, 317*c* that run to I/Os on the backside of the substrate 306*c*. These I/Os can then make contact to nodes in the logic chip's wiring 315*c*. I/Os formed at the top surface of the logic chip 303*c* can be used to deliver power to the logic chip 303*c* as well as the memory stack.

The embodiment of FIG. 3*d* has the same, lower memory stack structure as in FIG. 3*c*. Unlike the embodiment of FIG. 3*c*, however, the face of the upper logic chip 303*d* faces downward to interface with (the face of) the top memory chip 319*d* of the lower memory stack.

Any/all of the embodiments described above in FIGS. 3*a* through 3*d* can be manufactured by a wafer to wafer bonding approach.

For example, according to a first approach, a first wafer that is composed of logic chips is bonded to a second wafer that is composed of memory chips, where, the memory chips as laid out on the second wafer are aligned with the logic chips as laid out on the first wafer. Then, a third wafer composed of memory chips is bonded to the second wafer with the memory chips of the third wafer being aligned with the memory chips of the second wafer. Additional wafers of memory chips are then bonded sequentially to the most recently bonded memory chip wafer until the number of memory chip wafers that have been bonded to the overall structure corresponds to the desired number of memory chips in the memory chip stack. The structure of multiple stacked bonded wafers is then diced into individual stacks of a functional logic chip stacked with a memory chip stack.

According to a second approach, the reverse of the above described process is used. That is, memory chip wafers are sequentially bonded until the number of bonded memory chip wafers corresponds to the number of desired memory chips in the memory chip stack. A wafer composed of logic chips is then bonded to the stack of bonded memory chip wafers and the completed stack of wafers is diced into individual stacks of a logic chip stacked with a memory chip stack.

Note that either of these approaches could be used to form any of the embodiments of FIGS. 3*a* through 3*d*.

FIGS. 4*a* through 4*e* depict an embodiment of a process for bonding a memory wafer to a functional logic chip wafer, where, a face-to-back interface between memory and functional logic chips is formed. For ease of drawing FIGS. 4*a* through 4*e* only show one logic chip 403 from the logic chip wafer and one memory wafer 419 from the memory chip wafer. As observed in FIG. 4*a*, first, the memory and functional logic wafers 403, 419 are processed. Then, as observed in FIG. 4*b*, the memory wafer's substrate 418 is thinned and processed. Notably, the processing can include the formation of a short TSV 416 with metal fill. Likewise, as observed in FIG. 4*c*, the substrate 406 of the logic chip's wafer is processed to form TSVs 411 and associated wiring and contacts 410 to implement the back side power and/or signaling I/Os that are to make electrical contact with the semiconductor chip substrate. As observed in FIG. 4*d*, the memory wafer 419 is bonded to the logic chip wafer 403.

Then, as observed in FIG. 4*e*, a long TSV 417 with metal fill is formed into the exposed face of the memory wafer 419.

FIGS. 5*a* through 5*e* depict an embodiment of a process for bonding a memory wafer to a logic wafer, where, a face-to-face interface between the memory and functional logic chips is formed. As observed in FIG. 5*a*, first, the memory 519 and logic chip wafers 503 are formed. Then, as observed in FIG. 5*b*, the respective substrates 518, 506 of the memory and functional logic wafers 519, 503 are thinned. Then, as observed in FIG. 5*c*, the respective substrates 506, 518 of both wafers 503, 519 are processed to form back-side power/signaling TSVs, wiring and I/Os 511, 516, 510. As observed in FIG. 5*d*, the wafers 503, 519 are bonded. Then, as observed in FIG. 5*e*, long TSVs 517 and metal fill are formed in the memory wafer 503.

FIGS. 6*a* through 6*e* depict an embodiment of a process for bonding a logic chip wafer 603 to a memory chip wafer 619, where, a face-to-back interface between the logic and memory chips is formed. The memory chip wafer 619 can be the top memory chip wafer of a stack of memory chip wafers. As observed in FIG. 6*a*, first, the memory and functional logic wafers 603, 619 are processed. Then, as observed in FIG. 6*b*, the logic chip wafer's substrate 506 is thinned and processed. Notably, the processing can include the formation of a short TSV with metal fill. Likewise, as observed in FIG. 6*c*, the substrate side of the memory chip's wafer is processed to form TSVs and associated wiring and contacts to implement the back side power and/or signaling I/Os that make contact to the memory chip that will be beneath the memory chip in the memory wafer. Then, as observed in FIG. 5*d*, the logic chip wafer is bonded to the memory wafer. Then, as observed in FIG. 5*e*, the long TSV with metal fill is formed from the exposed (face) surface of the functional logic chip. This particular connection could be used, e.g., to run power or ground from the top/face side of the functional logic chip down to the memory chip stack.

FIGS. 7*a* through 7*e* depict an embodiment of a process for bonding a logic chip wafer 703 to a memory wafer 719, where, a face-to-face interface between the logic and memory chips 703, 719 is formed. The memory chip wafer 719 can be the top memory chip wafer of a stack of memory chip wafers. As observed in FIG. 7*a*, first the memory and logic chip wafers 703, 719 are formed. Then, as observed in FIG. 7*b*, the respective substrates 706, 718 of the memory and logic chip wafers 703, 719 are thinned. Then, as observed in FIG. 7*c*, the respective substrates 706, 718 of both wafers 703, 719 are processed to form back-side power/signaling TSVs, wiring and I/Os 711, 716, 710. As observed in FIG. 7*d*, the wafers 703, 719 are bonded. Then, as observed in FIG. 7*e*, long TSVs and metal fill 717 are formed in the logic chip wafer 703.

Following any of the processes described above with respect to FIGS. 4*a*-4*e*, 5*a*-5*e*, 6*a*-6*e* and 7*a*-7*e* the stacked logic chip and memory stack can be mounted on a semiconductor chip substrate. At least one other logic chip can also be mounted on the semiconductor chip substrate.

Figure 8:
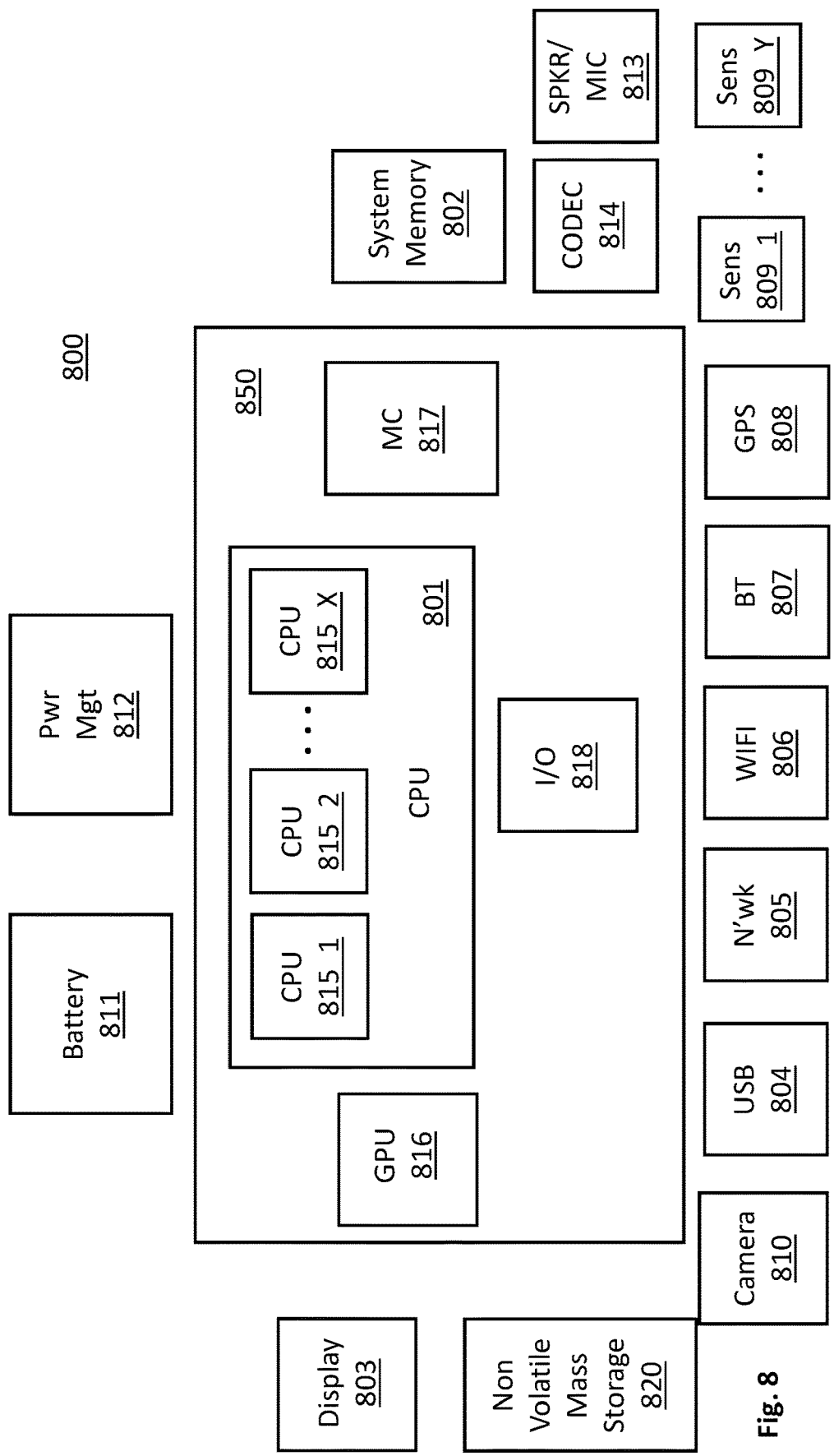
FIG. 8 shows a computing system.

FIG. 8 provides an exemplary depiction of a computing system 800 (e.g., a smartphone, a tablet computer, a laptop computer, a desktop computer, a server computer, etc.). As observed in FIG. 8, the basic computing system 800 may include a central processing unit 801 (which may include, e.g., a plurality of general purpose processing cores 815_1 through 815_X) and a main memory controller 817 disposed on a multi-core processor or applications processor, system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_Y, one or more cameras 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units 816, a memory management function 817 (e.g., a memory controller) and an I/O control function 818. The general purpose processing cores 815 typically execute the system and application software of the computing system. The graphics processing unit 816 typically executes graphics intensive functions to, e.g., generate graphics information that is presented on the display 803. The memory control function 817 interfaces with the system memory 802 to write/read data to/from system memory 802.

Each of the touchscreen display 803, the communication interfaces 804-807, the GPS interface 808, the sensors 809, the camera(s) 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850. The power management control unit 812 generally controls the power consumption of the system 800. The computing system also includes non volatile mass storage 820.

The computing system can include a multi-chip module such as any of the multi-chip module embodiments described above having a stacked logic chip and memory stack.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a stack of semiconductor chips, the stack of semiconductor chips comprising a logic chip that is vertically stacked with a memory stack, wherein, the logic chip comprises at least one of a GPU and CPU, the stack of semiconductor chips comprising a first semiconductor chip at a first end of the stack of semiconductor chips and a second semiconductor chip at a second end of the stack of semiconductor chips; and
a semiconductor chip substrate, the stack of semiconductor chips mounted on the semiconductor chip substrate at a first face of the first semiconductor chip, at least one other logic chip mounted on the semiconductor chip substrate, the at least one other logic chip not vertically stacked with the stack of semiconductor chips, the semiconductor chip substrate comprising wiring to interconnect the stack of semiconductor chips to the at least one other logic chip, wherein, electrical power is to be received at a second face of the second semiconductor chip that faces a direction opposite that of the first face of the first semiconductor chip.

2. The apparatus of claim 1 wherein the memory stack is between the semiconductor chip substrate and the logic chip.

3. The apparatus of claim 2 wherein a back of a top memory chip of the memory stack interfaces with a face of the logic chip.

4. The apparatus of claim 3 wherein a substrate of the logic chip comprises a through silicon via.

5. The apparatus of claim 2 wherein a face of a top memory chip of the memory stack interfaces with a face of the logic chip.

6. The apparatus of claim 5 wherein a substrate of the logic chip comprises a through silicon via.

7. The apparatus of claim 2 wherein the electrical power is provided to the logic chip at a top surface of the logic chip.

8. The apparatus of claim 1 wherein the logic chip is between the semiconductor chip substrate and the memory stack.

9. The apparatus of claim 8 wherein a back of the logic chip interfaces with a face of a bottom memory chip of the memory stack.

10. The apparatus of claim 9 wherein a substrate of the bottom memory chip of the memory stack comprises a through silicon via.

11. The apparatus of claim 8 wherein a face of the logic chip interfaces with a face of a bottom memory chip of the memory stack.

12. The apparatus of claim 11 wherein a substrate of the bottom memory chip of the memory stack comprises a through silicon via.

13. The apparatus of claim 8 wherein the electrical power is provided to the memory stack at a top surface of the memory stack.

14. A computing system, comprising:
a networking interface;
non volatile mass storage; and
a multi-chip module comprising a) and b) below:
a) a stack of semiconductor chips, the stack of semiconductor chips comprising a logic chip that is vertically stacked with a memory stack, wherein, the logic chip comprises at least one of a GPU and CPU, the stack of semiconductor chips comprising a first semiconductor chip at a first end of the stack of semiconductor chips and a second semiconductor chip at a second end of the stack of semiconductor chips; and
b) a semiconductor chip substrate, the stack of semiconductor chips mounted on the semiconductor chip substrate at a first face of the first semiconductor chip, at least one other logic chip mounted on the semiconductor chip substrate, the at least one other logic chip not vertically stacked with the stack of semiconductor chips, the semiconductor chip substrate comprising wiring to interconnect the stack of semiconductor chips to the at least one other logic chip, wherein, electrical power is to be received at a second face of the second semiconductor chip that faces a direction opposite that of the first face of the first semiconductor chip.

15. The computing system of claim 14 wherein the memory stack is between the semiconductor chip substrate and the logic chip.

16. The computing system of claim 15 wherein the electrical power is provided to the logic chip at a top surface of the logic chip.

17. The computing system of claim 15 wherein second electrical power is provided to at least one of the memory stack and the logic chip through the semiconductor chip substrate.

18. The computing system of claim 14 wherein the logic chip is between the semiconductor chip substrate and the memory stack.

19. The computing system of claim 18 wherein the electrical power is provided to the memory stack at a top surface of the memory stack.

20. A method, comprising:
    stacking multiple memory chip wafers and a logic chip wafer;
    dicing the stacked memory chip wafers and logic chip wafer to form a logic chip that is vertically stacked with a memory chip stack;
    mounting the stacked logic chip and memory chip stack on a semiconductor chip substrate;
    mounting at least one other logic chip to the semiconductor chip substrate such that the at least one other logic chip is not vertically stacked with the stacked logic chip and memory chip stack; and,
    connecting a power connection to a first end of the stacked logic chip and memory chip stack that is opposite a second end of the stacked logic chip and memory chip stack where the stacked logic chip and memory chip stack are mounted to the semiconductor chip substrate.

* * * * *